(12) United States Patent
Cordier

(10) Patent No.: US 12,079,679 B2
(45) Date of Patent: Sep. 3, 2024

(54) CONTACTLESS COMMUNICATION DEVICE

(71) Applicant: STMicroelectronics (Rousset) SAS, Rousset (FR)

(72) Inventor: Nicolas Cordier, Aix-en-Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 18/107,245

(22) Filed: Feb. 8, 2023

(65) Prior Publication Data
US 2023/0252258 A1   Aug. 10, 2023

(30) Foreign Application Priority Data

Feb. 9, 2022  (FR) ....................................... 2201146

(51) Int. Cl.
*G06K 19/07* (2006.01)
*H05K 1/18* (2006.01)

(52) U.S. Cl.
CPC ......... *G06K 19/0723* (2013.01); *H05K 1/181* (2013.01); *H05K 2201/10098* (2013.01); *H05K 2201/10151* (2013.01)

(58) Field of Classification Search
CPC .................................................. G06K 19/0723
USPC ......................................................... 235/492
See application file for complete search history.

(56) References Cited

U.S. PATENT DOCUMENTS

| 6,325,284 | B1* | 12/2001 | Walker | .................. | G06Q 30/02 |
| | | | | | 235/487 |
| 11,003,973 | B2 | 5/2021 | Sismundo et al. | | |
| 2011/0309146 | A1* | 12/2011 | Zazzu | .................... | G06K 19/16 |
| | | | | | 235/440 |
| 2012/0228478 | A1* | 9/2012 | Guillaud | ............ | G06K 19/0716 |
| | | | | | 250/208.2 |
| 2016/0148194 | A1* | 5/2016 | Guillaud | .............. | G06Q 20/341 |
| | | | | | 235/492 |
| 2018/0232615 | A1* | 8/2018 | Tarantino | ......... | G06K 19/07372 |
| 2021/0392499 | A1 | 12/2021 | Kirkeby et al. | | |
| 2022/0335265 | A1* | 10/2022 | Osborn | ............ | G06K 19/07705 |
| 2023/0011926 | A1* | 1/2023 | Walz | ....................... | G09F 3/207 |

FOREIGN PATENT DOCUMENTS

| EP | 3547726 A1 | 10/2019 |
| FR | 2968803 A1 | 6/2012 |
| GB | 2407189 A | 4/2005 |

OTHER PUBLICATIONS

INPI Search Report and Written Opinion for priority application, FR 2201146, report dated Sep. 22, 2022, 10 pgs.

* cited by examiner

*Primary Examiner* — Ahshik Kim
(74) *Attorney, Agent, or Firm* — Crowe & Dunlevy LLC

(57) ABSTRACT

A contactless communication device includes an electronic integrated circuit chip and an antenna coupled to the electronic integrated circuit chip to supply an electric signal for powering the electronic integrated circuit chip. An ambient luminosity detection element is coupled to the electronic integrated circuit chip. An ambient luminosity level measured by the ambient luminosity detection element is supplied to the electronic integrated circuit chip for comparison to a darkness threshold. A contactless communication is authorized only when the measured ambient luminosity level is greater than the darkness threshold.

20 Claims, 3 Drawing Sheets

CONTACTLESS COMMUNICATION DEVICE

PRIORITY CLAIM

This application claims the priority benefit of French Application for Patent No. 2201146, filed on Feb. 9, 2022, the content of which is hereby incorporated by reference in its entirety to the maximum extent allowable by law.

TECHNICAL FIELD

The present disclosure generally concerns the field of chip cards, also referred to as integrated circuit cards, and, more particularly, the field of contactless chip cards, for example contactless payment cards.

BACKGROUND

Contactless chip cards are, for the most part, based on near-field communication technology (NFC). During a contactless transaction, the chip card exchanges data with an NFC reader, for example, a payment terminal, located in the vicinity of the chip card, with no direct electric connection between the chip card and the reader. Given that the entering of a password or code is not necessary to authorize the exchange, the latter may be performed without the knowledge of the owner of the chip card. In particular, a person having an NFC reader and located within range of the chip card may attempt to fraudulently recover the card data, or even to validate a payment which has not been consented to by the owner of the chip card. As an example, a data exchange without consent may be performed if a person attempting to engage in a fraud discreetly approaches a payment terminal close to a user's chip card, located, for example, in a pocket or a bag of the user, without the latter noticing.

There is a need in the art to improve the security of contactless chip cards.

SUMMARY

An embodiment overcomes all or part of the disadvantages of known chip cards.

An embodiment provides a contactless communication device comprising an electronic chip and an antenna coupled to the electronic chip to supply an electric signal for powering the electronic chip, the device further comprising an ambient luminosity detection element, the electronic chip being configured to read an ambient luminosity level measured by the ambient luminosity detection element, compare said ambient luminosity level with a predefined darkness threshold, and authorize a contactless communication only when said ambient luminosity level is greater than said darkness threshold.

According to an embodiment, the ambient luminosity detection element is an ambient light sensor.

According to an embodiment, the ambient luminosity detection element is a photosensitive resistor.

According to an embodiment, the ambient luminosity detection element is external to the electronic chip.

According to an embodiment, the ambient luminosity detection element is a band made of a photoresistive polymer or of a photoresistive resin.

According to an embodiment, the band extends across a surface area greater than 4 cm$^2$.

According to an embodiment, the ambient luminosity detection element is integrated to the electronic chip.

According to an embodiment, said darkness threshold is stored in a memory internal to the electronic chip.

According to an embodiment, said darkness threshold is an adjustable threshold.

According to an embodiment, the device comprises a plastic support inside and/or on top of which are attached the electronic chip, the antenna, and the ambient luminosity detection element, the assembly comprising the support, the electronic chip, the antenna, and the ambient luminosity detection element forming a contactless integrated circuit card.

Another embodiment provides a method of use of a contactless communication device comprising an electronic chip and an antenna coupled to the electronic chip to deliver an electric signal for powering the electronic chip, the device further comprising an ambient luminosity detection element.

The method comprises the successive steps of: a) reception by the antenna, of an electromagnetic field emitted by an external reader and delivery of a signal for powering the electronic chip and the ambient luminosity detection element; b) measurement of the ambient luminosity level by means of the ambient luminosity detection element; c) comparison of the measured ambient luminosity level with a predefined darkness threshold; and d) establishing of a communication with the external reader only if the measured ambient luminosity level is greater than the darkness threshold.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the different elements forming the described chip cards is not detailed, the forming of these elements being within the abilities of those skilled in the art based on the indications of the present disclosure. Further, the details of implementation of a transaction or of a data exchange between a chip card and an external reader are not detailed, the implementation of such a transaction or data exchange being within the abilities of those skilled in the art based on the indications of the present disclosure.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1A:
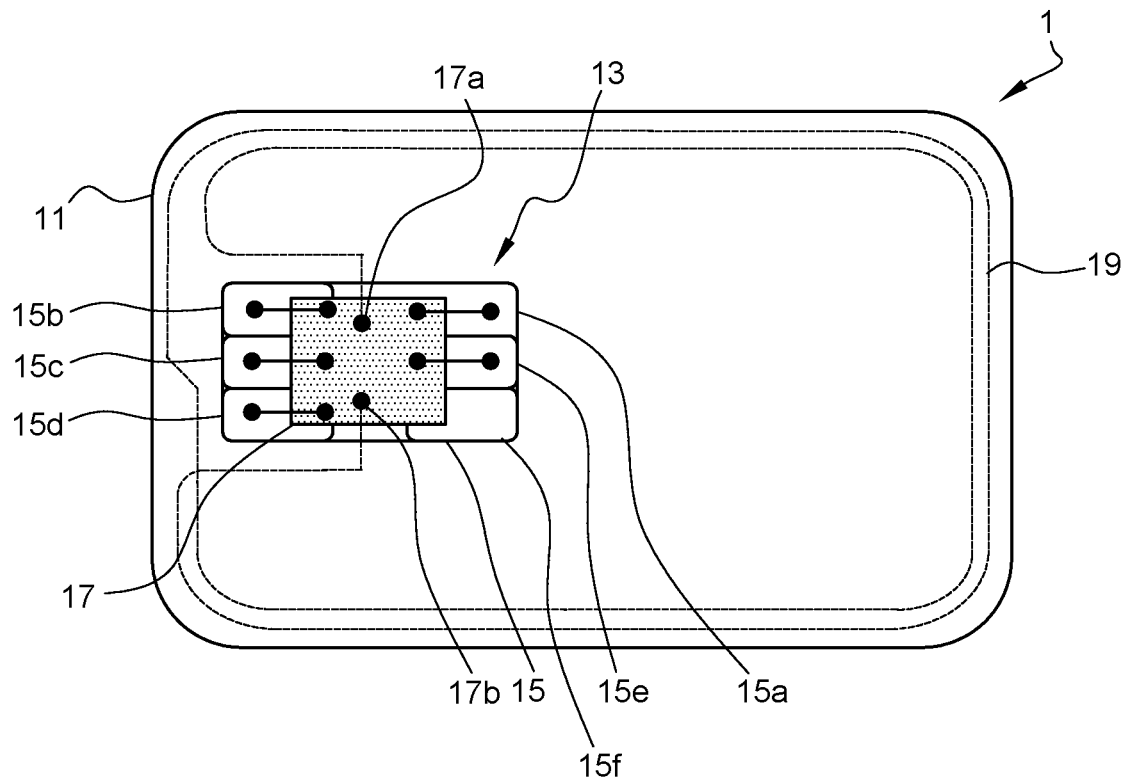
FIG. 1A is a partial simplified top view of an example of a contactless chip card.

FIG. 1A is a partial simplified top view illustrating an example of a contactless chip card 1, for example, a contactless payment card.

Figure 1B:
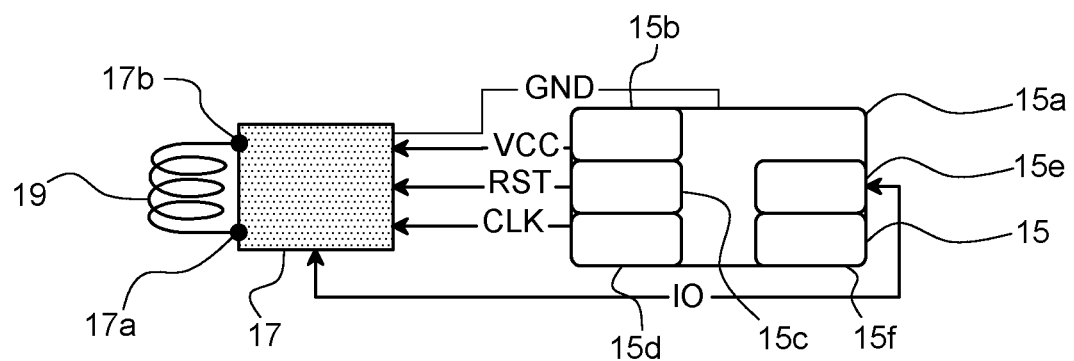
FIG. 1B is an equivalent electric diagram of the chip card of FIG. 1A.

FIG. 1B is an equivalent electric diagram of the chip card of FIG. 1A.

In this example, chip card 1 is adapted to implementing both contact transactions, during which card 1 is electrically connected to contact terminals of an external reader, and contactless transactions, by electromagnetic coupling, during which card 1 is not electrically connected to the contact terminals of an external reader.

Chip card 1 comprises a support 11 inside and/or on top of which is arranged at least one printed circuit board 13, and an integrated circuit chip 17.

Support 11 is, for example, of generally rectangular shape. Support 11 is, for example, made of plastic, or cardboard, or of paper. Support 11 is, for example, monolayer or multilayer.

Printed circuit board 13 comprises an assembly 15 of a plurality of metal areas, six metal areas 15a, 15b, 15c, 15d, 15e, and 15f in the shown example, intended to be electrically connected to contact terminals of an external reader during a contact transaction. Chip 17 is connected to at least some of these metal areas 15. In FIG. 1A and FIG. 1B, chip 17 has been shown on the front surface side of printed circuit board 13, that is, on the side of the surface of printed circuit board 13 comprising metal areas 15a, 15b, 15c, 15d, 15e, and 15f. In practice, chip 17 is preferably arranged on the side of the printed circuit board 13 opposite to metal areas 15, and covered with support 11. It should further be noted that chip 17 has not been shown to scale in FIG. 1A and FIG. 1B. In practice, chip 17 may have lateral dimensions much smaller than those of metal areas 15, for example, lateral dimensions smaller than 1 mm. Metal areas 15, for example, each have lateral dimensions greater than or equal to 1 mm, for example, in the range from 1 mm to 1 cm.

In FIGS. 1A and 1n FIG. 1B, six metal areas 15 have been shown. In practice, the number of areas 15 may be different from six, for example, equal to eight.

During a contact transaction, the metal areas of printed circuit board 13 enable an external reader terminal (not shown), for example, a payment terminal, to electrically power chip 17 and exchange data with chip 17. The dimensions and the layout of metal areas 15 on support 11 may comply with standards so that chip card 1 is compatible with usual reader terminals.

As an example, when card 1 is introduced into a reader terminal for the implementation of a contact transaction, metal areas 15a, 15b are respectively connected to a terminal of application of a low power supply potential of chip 17, for example, the ground, and to a terminal of application of a high power supply potential VCC of chip 17, for example, a fixed DC potential, for example, a potential in the order of 5 V. Area 15c is, for example, connected to a terminal of application of a signal RST for resetting chip 17. Area 15d is, for example, connected to a terminal for delivering a clock signal CLK of chip 17. Area 15e is, for example, connected to a data input-output terminal IO of chip 17.

As an example, chip 17 comprises a microcontroller (not detailed in the drawing).

To allow the implementation of contactless transactions, chip card 1 further comprises at least one antenna 19 connected to printed circuit board 13. In this example, antenna 19 is a planar coil comprising one or a plurality of loops or spirals obtained, for example, by depositing one or a plurality of metal tracks, for example, made of copper, in the thickness of support 11. As an example, antenna 19 has its ends respectively connected to terminals 17a and 17b of chip 17.

Antenna 19, for example, comprises two conductive loops. The loops of antenna 19, for example, have lateral dimensions greater than one cm, for example, substantially equal to the lateral dimensions of support 11, for example, in the order of 5×9 cm. The described embodiments are however not limited to this specific case.

As a variant, not shown, antenna 19 is not directly connected to the terminals 17a and 17b of chip 17, but is coupled to chip 17 by electromagnetic coupling, via a second antenna (not shown) of smaller size, for example, a coil antenna, which is itself connected to chip 17.

During a contactless transaction, metal areas 15 are not electrically connected to an external reader. Antenna 19 receives a modulated electromagnetic field originating from the external reader. This results in the occurrence of an AC electric current in antenna 19. This current is rectified and converted into a DC voltage for powering chip 17. Once powered, chip 17 is adapted to exchanging data with the reader by modulation of the electromagnetic field emitted by the reader, according to known near-field communication methods, for example, by modulation of the load seen by antenna 19.

Figure 2:
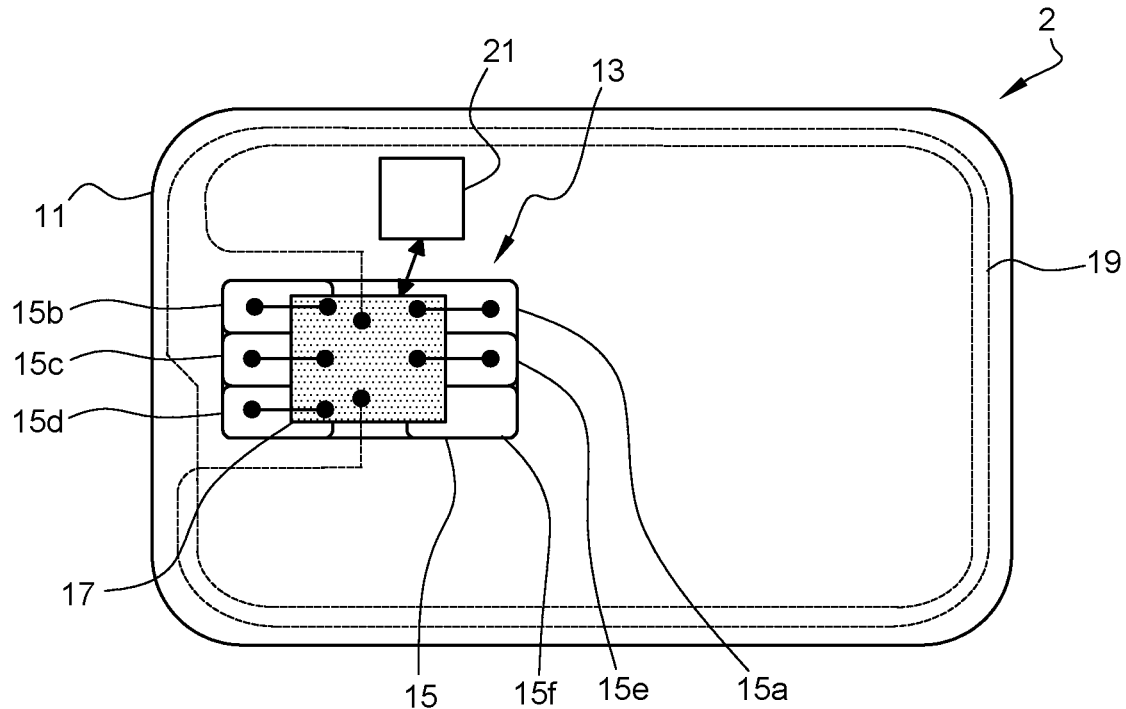
FIG. 2 is a partial simplified top view of an example of a contactless chip card according to a first embodiment.

FIG. 2 is a partial simplified top view of an example of a contactless chip card 2 according to a first embodiment.

The chip card 2 of FIG. 2 comprises the same elements as the chip card 1 of FIG. 1A and FIG. 1B, arranged substantially in the same way. These elements will not be detailed again hereafter.

According to an aspect of an embodiment, the smart card 2 of FIG. 2 further comprises an ambient luminosity detection element, called photodetection element or ambient luminosity sensor 21, coupled to chip 17. As an example, ambient luminosity sensor 21 is directly connected, with no intermediate component, to chip 17.

In the presence of an electromagnetic field emitted by a contactless reader terminal, luminosity sensor 21 supplies an electric signal representative of the ambient luminosity level and transmits it to chip 17. Chip 17 is configured to read the luminosity level measured by sensor 21 and compare this level with a predefined darkness threshold, for example, stored in a memory circuit of chip 17. Chip 17 is further configured to authorize a transaction or a data exchange with the reader only if the luminosity level measured by sensor 21 is greater than the darkness threshold.

Thus, in the embodiment of FIG. 2, it is provided to "neutralize" chip card 2, that is, to forbid transactions or data exchanges with an external reader, when the ambient luminosity level measured by sensor 21 is lower than a predefined darkness threshold. This enables to avoid for fraudulent transactions to be implemented when chip card 2 is put away in the user's pocket, in a bag, a card holder, or any other usual storage container, generally opaque and accordingly dark. Thus, transactions can only be performed when the user takes their chip card out of its storage place and exposes it to ambient light. The darkness threshold may be a fixed threshold, defined on design of the chip card, or an adjustable threshold. It may, for example, be provided for the darkness threshold to be defined by the user according to their habits of use of the chip card. Thus, the threshold may be higher if the chip card is intended to be mainly used in strong luminosity conditions and lower if the chip card is intended to be used in low luminosity conditions.

It should be noted that in the embodiment of FIG. 2, when a contactless reader terminal emits an electromagnetic field within range of the chip card, chip 17 is still powered, whether the chip card is on not in darkness. The blocking of transactions in darkness conditions or the authorization of transactions in conditions of luminosity higher than the darkness threshold may be controlled by electric signals internal to the chip.

Figure 3:
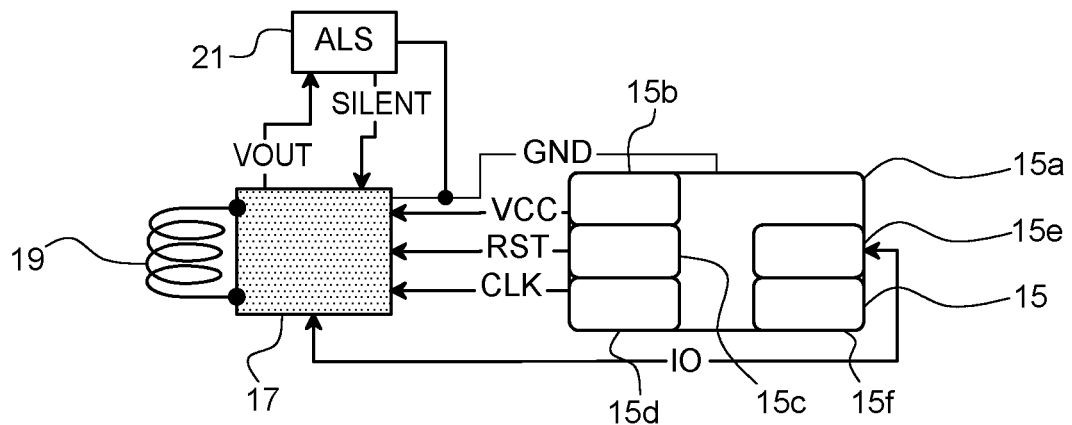
FIG. 3 is an equivalent electric diagram of a first example of embodiment of the chip card of FIG. 2.

FIG. 3 is an equivalent electric diagram of a first example of embodiment of the chip card 2 of FIG. 2.

In FIG. 3, photodetection element 21 is an ambient light sensor (ALS), for example comprising a photodiode and an electronic circuit for reading from the photodiode.

As an example, sensor 21 receives a power supply voltage VOUT delivered by chip 17 when the latter is electrically powered by electromagnetic coupling via antenna 19.

When it is powered with voltage VOUT, sensor 21 supplies chip 17 with a signal SILENT representative of the captured light intensity.

As an example, signal SILENT is an analog signal. Sensor 21 is then associated with an analog-to-digital converter, not shown, for example, integrated in chip 17.

As a variant, signal SILENT is directly a digital signal.

Signal SILENT is, for example, interpreted by the microcontroller present in chip 17, not shown.

In the shown example, sensor 21 is external to chip 17. Sensor 21 is, for example, mounted on printed circuit board 13 or arranged at any other location on support 11 and connected to chip 17 by conductive tracks formed across the thickness of support 11. As a variant, sensor 21 is integrated in chip 17, which simplifies its integration by usual contactless printed circuit board manufacturing methods.

Figure 4:
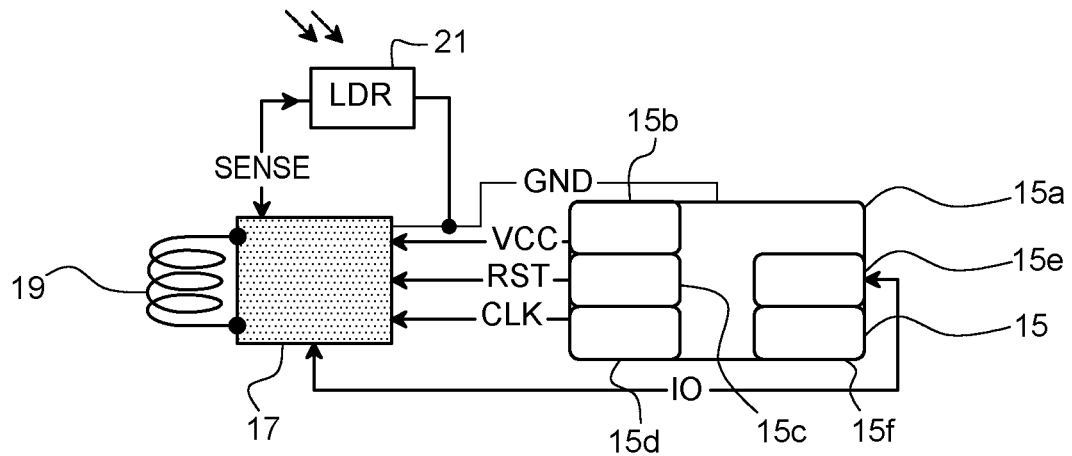
FIG. 4 is an equivalent electric diagram of a second example of embodiment of the chip card of FIG. 2.

FIG. 4 is an equivalent electric diagram of a second example of embodiment of the chip card 2 of FIG. 2.

In this example, photodetection element 21 is a photoresistor, that is, a resistive element having its resistivity varying according to the received light intensity (LDR, for "Light-Dependent Resistor"). In this example, photoresistor 21 has its ends respectively connected to two contact terminals of chip 17.

As an example, chip 17 is adapted, when it is electrically powered by electromagnetic coupling via antenna 19, to applying a voltage across the photoresistor, and to measuring a current SENSE crossing the photoresistor, or to applying a current through the photoresistor and to measuring a voltage SENSE across the photoresistor. Thus, chip 17 is adapted to measuring an electric signal SENSE representative of the value of resistance 21, and thus of the ambient luminosity.

Photoresistor 21 may be a discrete component, for example, based on silicon, electrically connected to chip 17. As a variant, photoresistor 21 may be integrated to chip 17.

Figure 5:
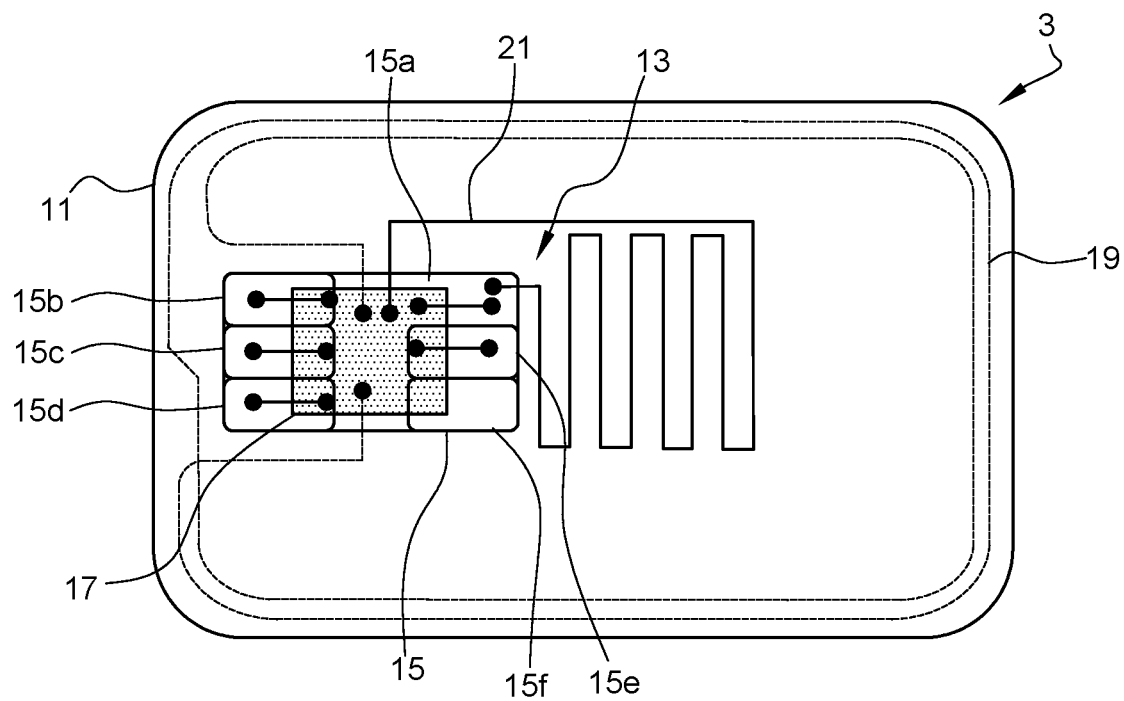
FIG. 5 is a partial simplified top view of the chip card of FIG. 4.

FIG. 5 is a partial simplified top view of an example of embodiment of the chip card of FIG. 4.

In this example, photoresistor 21 is an extended photoresistive film at the surface of support 11.

As an example, photosensitive film 21 has the shape of a band, for example, arranged in a coil or a serpentine shape, extending across all or part of the surface of support 11, preferably across a surface area greater than the surface area of a finger, for example, across a surface area greater than 4 cm$^2$.

Photosensitive film 21 is, for example, made of a photoresistive polymer or a photoresistive resin.

An advantage of the example of FIG. 5, with the surface area size of the photosensitive film 21, is that it enables to avoid for the user to unintentionally hide detection element 21 with their finger or their hand when they present their card in front of a reader terminal for a consented transaction.

Various embodiments and variants have been described. Those skilled in the art will understand that certain features of these various embodiments and variants may be combined, and other variants will occur to those skilled in the art. In particular, although an example of application to contactless payment chip card has been described hereabove, the described embodiments are not limited to this specific application. For example, the described embodiments may be adapted to other types of NFC devices such as electronic passports, access control cards, and electronic ticketing, etc.

Further, the present disclosure takes the example of the NFC communication technology. However, the described embodiments may apply to other types of contactless communication technologies, such as communication by radio frequency identification (RFID).

Finally, the practical implementation of the described embodiments and variations is within the abilities of those skilled in the art based on the functional indications given hereabove.

The invention claimed is:

1. A contactless communication device, comprising:
   an electronic integrated circuit chip;
   an antenna coupled to the electronic integrated circuit chip to supply an electric signal for powering the electronic integrated circuit chip; and
   an ambient luminosity detection element external to the electronic integrated circuit chip;
   wherein the ambient luminosity detection element comprises a band made of a photoresistive polymer or of a photoresistive resin that is electrically coupled to the electronic integrated circuit chip; and
   wherein the electronic integrated circuit chip is configured to read an ambient luminosity level measured by the ambient luminosity detection element, compare said ambient luminosity level with a darkness threshold, and authorize a contactless communication only when said ambient luminosity level is greater than said darkness threshold.

2. The device according to claim 1, wherein the band extends across a surface area greater than 4 cm$^2$.

3. The device according to claim 1, wherein said darkness threshold is stored in a memory internal to the electronic integrated circuit chip.

4. The device according to claim 1, wherein said darkness threshold is an adjustable threshold.

5. The device according to claim 1, further comprising a plastic support wherein the electronic chip, the antenna, and the ambient luminosity detection element are one of attached inside the plastic support or attached on top of the plastic support.

6. The device according to claim 5, wherein an assembly comprising the plastic support, the electronic chip, the antenna, and the ambient luminosity detection element forms a contactless integrated circuit card.

7. The device according to claim 5, wherein the band made of the photoresistive polymer or of the photoresistive resin is part of the plastic support.

8. The device according to claim 5, wherein the band is arranged in a coil or a serpentine shape.

9. The device according to claim 8, wherein the band extends across at least a part of a surface of the plastic support.

10. The device according to claim 1, wherein the band made of the photoresistive polymer or of the photoresistive resin is a light dependent resistor having a resistivity that varies according to received light intensity.

11. The device according to claim 1, wherein the band is arranged in a coil or a serpentine shape.

12. A contactless communication device, comprising:
a plastic support;
an electronic integrated circuit chip located within the plastic support;
an antenna coupled to the electronic integrated circuit chip to supply an electric signal for powering the electronic integrated circuit chip; and
an ambient luminosity detection element formed by a photosensitive resistor extending on a surface of the plastic support;
wherein the electronic integrated circuit chip is configured to read an ambient luminosity level measured by the ambient luminosity detection element, compare said ambient luminosity level with a darkness threshold, and authorize a contactless communication only when said ambient luminosity level is greater than said darkness threshold.

13. The device according to claim 12, wherein the photosensitive resistor comprises a band made of a photoresistive polymer that is electrically coupled to the electronic integrated circuit chip.

14. The device according to claim 12, wherein the photosensitive resistor comprises a band made of a photoresistive resin that is electrically coupled to the electronic integrated circuit chip.

15. The device according to claim 12, wherein the photosensitive resistor occupies a surface area on the surface of the plastic support greater than 4 $cm^2$.

16. The device according to claim 12, wherein said darkness threshold is stored in a memory internal to the electronic integrated circuit chip.

17. The device according to claim 12, wherein said darkness threshold is an adjustable threshold.

18. The device according to claim 12, wherein an assembly comprising the plastic support, the electronic chip, the antenna, and the ambient luminosity detection element forms a contactless integrated circuit card.

19. The device according to claim 12, wherein the photosensitive resistor is formed by a band of photosensitive material having one of a coil shape or a serpentine shape.

20. The device according to claim 19, wherein the coil shape or serpentine shape occupies a surface area on the surface of the plastic support greater than 4 $cm^2$.

* * * * *